Jan. 2, 1968 J. L. BACHMAN 3,361,868

SUPPORT FOR ELECTRICAL CIRCUIT COMPONENT

Filed Aug. 4, 1966

INVENTOR.
James L. Bachman
BY
Barnard, McGlynn & Reising
ATTORNEYS

United States Patent Office 3,361,868

Patented Jan. 2, 1968

3,361,868

SUPPORT FOR ELECTRICAL CIRCUIT COMPONENT

James L. Bachman, Golden, Colo., assignor to Coors Porcelain Company, Golden, Colo., a corporation of Colorado Filed Aug. 4, 1966, Ser. No. 570,210
3 Claims. (Cl. 174—52)

ABSTRACT OF THE DISCLOSURE

The subject matter of this invention is a support for an electrical circuit component comprising a unitary member of relatively hard copper having a threaded shank portion and a head portion, a plate of relatively soft copper bonded to the head portion and a ceramic wafer bonded to the plate of relatively soft copper. The unitary member is of relatively hard copper to assure against breakage during installation of the support and the plate is of relatively soft copper to assure against breakage of the ceramic wafer during operation of the electrical circuit component due to differences in thermal expansion.

Figure 1:
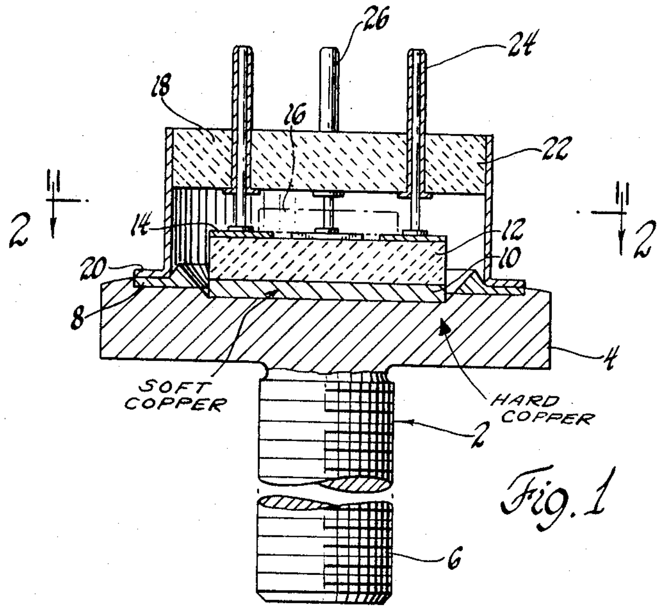

This invention relates to an improved support for mounting transistors, integrated circuits, and other solid state electrical circuit components.

A support for a solid state electrical circuit component must provide the requisite electrical insulation for mounting of the component together with the necessary electrical leads and adequate encapsulation. Additionally, the support must have good thermal conductivity in order to dissipate the heat generated by the component during operation. Hence, it is essential that the support be made of a metal having excellent thermal conductivity, copper being the metal commonly used. The support can, in effect, serve as a heat sink for the circuit component. For the electrical insulation, beryllium oxide ceramic is preferred because of its good thermal conductivity though aluminum oxide ceramic, which is less expensive, will often suffice. One of the most common types of supports incorporating these features consists of a unitary copper member, having a shape much like an ordinary screw, with a generally flat head portion which serves as a pad to which a beryllium oxide or other ceramic wafer can be bonded and with a threaded shank portion so that the support can be threaded into a chassis or the like for the electrical circuit. Printed or other electrical leads are provided on the ceramic wafer for mounting of the solid state component and an hermetically sealed encapsulation is bonded to the support with the electrical leads extending therethrough in sealed relationship.

I have now discovered that a considerable improvement can be accomplished in a support of the type described if that surface of the copper member to which the ceramic wafer is bonded is formed of very ductile copper and the remainder of the copper member, including the shank portion, is formed of a less-ductile and therefore relatively hard copper, the ductile copper surface preferably being provided by a ductile copper plate brazed or otherwise suitably bonded to the other portion of the copper member. Hence, the copper member instead of being of unitary construction is formed of two pieces, the piece which includes the shank being of a relatively hard copper and the piece to which the ceramic wafer is secured being a relatively soft copper. With such structure the hard copper piece affords maximum strength, commensurate with optimum thermal conductivity, to assure against fracture or distortion of the support when it is threaded into the chassis while at the same time providing assurance against breakage of the ceramic wafer during operation of the device due to the difference in coefficients of thermal expansion between the ceramic wafer and the copper. Because the portion of the copper member in contact with the ceramic wafer is quite ductile or soft, it allows for sufficient relative movement between the copper and the ceramic, due to differences in expansion, to prevent cracking of the ceramic. The overall result is a considerable increase in durability—increased assurance against breakage of the copper member during its installation, and increased assurance against breakage of the ceramic wafer during operation.

Figure 2:
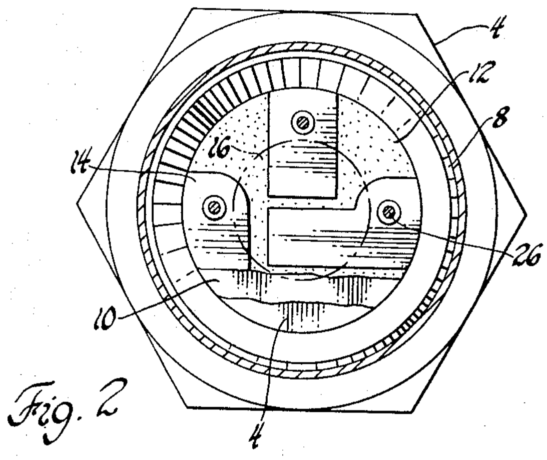

Other features and advantages of the invention will appear more clearly from the following detailed description of a preferred embodiment thereof made with reference to the drawings in which:

FIGURE 1 is side view in section of an electrical circuit component support embodying the invention; and FIGURE 2 is a top view of the structure shown in FIGURE 1 but with parts broken away to better illustrate the key feature of the invention.

Referring now to FIGURE 1, the support shown comprises a copper member 2 having a head portion 4 and a threaded shank portion 6. The top surface of the head portion is recessed at the center and has a steel ring 8 bonded thereto adjacent the periphery thereof. As can best be seen in FIGURE 2, the head portion is of hexagonal shape so that a tool with a hexagonal socket can be used to thread the device into a radio chassis or the like.

In accordance with the invention, the recess in the upper surface of the head portion 4 receives a copper plate 10 which is brazed or otherwise suitably bonded to the member 2. The member 2 is of relatively hard copper, preferably with a hardness of at least about 65 Rockwell, 15–T scale, and the copper plate 10 is of a ductile copper with a hardness, less than about 60 Rockwell, 15–T scale. The heat treatments for the copper to provide the desired hardnesses are, of course, well known in the metallurgical art.

A beryllium oxide ceramic wafer 12 is bonded to the upper surface of the copper plate 10. The bond between the copper and ceramic can be accomplished, for example, by metalizing the bottom surface of the ceramic wafer by any of various well-known ceramic metalizing techniques, and the metalized surface then suitably brazed or soldered to the copper plate.

The upper surface of the ceramic wafer 12 has metalized leads applied in accordance with conventional techniques to provide the electrical leads, as shown at 14, for the solid state electrical component mounted on the wafer, the solid state component being shown in broken outline at 16. The encapsulation for the circuit component comprises a metal sleeve 18 having an outwardly extending annular flange 20 which is brazed or soldered to the metal ring 8 to thereby form an hermetic seal. A ceramic disc 22, preferably of beryllium oxide ceramic, is bonded within the upper end of the metal sleeve 18. Three openings toward the center of the ceramic disc 22 accommodate metal tubes, as shown at 24, through which metal lead wires 26 extend in bonded sealed relationship therewith. The hermetically sealed bonds between the ceramic disc 22 and the various metal components can be accomplished as aforesaid; i.e. by metalizing the ceramic and then brazing the metalized surface to the metal part.

Because the copper member 2 is formed of a relatively hard copper, considerable torque can be applied thereto when threading it into the radio chassis without danger of fracture which otherwise can occur particularly at the juncture between the shank 6 and the head 4. At the same time, because the plate 10 is of a relatively soft copper there is little danger of cracking of the ceramic wafer 12 albeit the members 10 and 12 have considerably different coefficients of thermal expansion.

It will be understood that while the invention has been described specifically with reference to a preferred embodiment thereof various changes and modifications may be made all within the full and intended scope of the claims which follow.

The embodiments of the invention in which an exclusive property or privilege is claimed are defined as follows:

1. A support for an electrical circuit component comprising a unitary relatively hard copper member having a threaded shank portion at one end thereof and a head portion at the other end thereof, a relatively soft copper plate bonded to said head portion adjacent the center thereof and a ceramic wafer bonded to said relatively soft copper plate.

2. A support, as set forth in claim 1, wherein said unitary copper member has a hardness of at least 65 Rockwell 15–T scale and said copper plate has a hardness of less than 60 Rockwell 15–T scale.

3. A support, as set forth in claim 1, wherein said ceramic member is a wafer of beryllium oxide ceramic having electrical leads thereon for connection to the circuit component.

References Cited

UNITED STATES PATENTS 3,015,760 1/1962 Weil.
3,020,454 2/1962 Dixon.

DARRELL L. CLAY, *Primary Examiner.*